United States Patent
Hietala et al.

(10) Patent No.: US 7,251,298 B1
(45) Date of Patent: Jul. 31, 2007

(54) RECEIVER ARCHITECTURE ELIMINATING STATIC AND DYNAMIC DC OFFSET ERRORS

(75) Inventors: Alexander Wayne Hietala, Phoenix, AZ (US); Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 755 days.

(21) Appl. No.: 10/644,231

(22) Filed: Aug. 20, 2003

(51) Int. Cl.
*H04L 27/04* (2006.01)
*H04B 1/26* (2006.01)

(52) U.S. Cl. .................... 375/340; 455/196.1

(58) Field of Classification Search ............... 375/316, 375/344, 345, 346, 340; 455/209, 208, 205, 455/189.1, 196.1, 230, 255, 258, 259
See application file for complete search history.

(56) References Cited

U.S. PATENT DOCUMENTS

| | | | | |
|---|---|---|---|---|
| 5,715,529 | A * | 2/1998 | Kianush et al. | 455/266 |
| 6,085,075 | A * | 7/2000 | Van Bezooijen | 455/260 |
| 6,282,413 | B1 * | 8/2001 | Baltus | 455/260 |
| 6,356,597 | B1 * | 3/2002 | Jackson et al. | 375/308 |
| 6,850,748 | B2 * | 2/2005 | Song et al. | 455/302 |
| 6,915,117 | B2 * | 7/2005 | Chominski et al. | 455/118 |
| 2003/0076899 | A1 * | 4/2003 | Kumar et al. | 375/316 |

OTHER PUBLICATIONS

Shahrzad Tadjpour, Ellie Cijvat, Emad Hegazi, and Asad A. Abidi, "A 900-MHz Dual Conversion Low-IF GSM Reciver in 0.35-μm CMOS," IEEE Journal of Solid-State Circuits, vol. 36, No. 12, Dec. 2001, pp. 1992-2002.

Shahrzad Tadjpour, Ellie Cijvat, Emad Hegazi, and Asad A. Abidi, "A 900-MHz Dual Conversion Low-IF GSM Reciver in 0.35-μm CMOS," IEEE Solid-State Circuits Conference, Session 18/3G Wireless, Paper 18.5, Feb. 7, 2001.

Jan Crols and Michel S. J. Steyaert, "A Single-Chip 900 MHz CMOS Receiver Front-End with a High Performance Low-IF Topology," IEEE Journal of Solid-State Circuits, vol. 30, No. 12, Dec. 1995, pp. 1483-1492.

* cited by examiner

*Primary Examiner*—Jay Patel
*Assistant Examiner*—Vineeta Panwalkar
(74) *Attorney, Agent, or Firm*—Withrow & Terranova, PLLC (57) ABSTRACT

The present invention provides a receiver frontend that eliminates static and dynamic DC errors and has improved second order intermodulation distortion (IMD2) performance. The receiver frontend includes a first mixer that multiplies a received signal and a first local oscillator (LO) signal to produce an intermediate frequency (IF) signal. A second mixer multiplies the IF signal and a second LO signal to produce an output signal. A first divider circuit divides a reference signal from a reference oscillator by a first divisor N to produce the first LO signal, and a second divider circuit divides the reference signal by a second divisor M to produce the second LO signal. Preferably, the first and second divisors N and M are each integers greater than one (1), and the second divisor M is not an integer multiple of the first divisor N.

33 Claims, 6 Drawing Sheets

RECEIVER ARCHITECTURE ELIMINATING STATIC AND DYNAMIC DC OFFSET ERRORS

FIELD OF THE INVENTION

The present invention relates to a radio receiver, and in particular to a receiver architecture that eliminates essentially all static and dynamic DC offset errors and improves second order intermodulation distortion (IMD2) performance.

BACKGROUND OF THE INVENTION

In order to reduce the number of components and increase the battery life of portable communications devices, many receiver architectures perform direct conversion, which converts a received signal from a radio frequency directly to baseband. Although direct conversion receiver architectures benefit the communication device by decreasing device size and increasing battery life, the performance of the receiver is diminished due to decreased second order intermodulation distortion (IMD2) performance and static and dynamic DC errors.

IMD2 performance of a direct conversion receiver is degraded because the desired output signal of the direct conversion receiver is near DC. IMD2 components are also near DC and are not filtered. Thus, the desired output signal and the IMD2 components are both co-located in frequency and become inseparable.

Direct conversion receivers include local oscillators that generate a frequency equal to or harmonically related to the frequency of the received signal. Because the frequency of the local oscillator is equal to or harmonically related to the frequency of the received signal, there is coupling between the blocker signals and the output of the local oscillator. Thus, during downconversion, the blocker signals are mixed with themselves, thereby producing the square of the blocker signals at DC.

In addition to intermodulation distortion, static and dynamic DC errors degrade the performance of direct conversion receivers. One static DC error is a residual DC offset term due to leakage of the local oscillator into the received signal. Thus, the output of the local oscillator is mixed with itself during downconversion, thereby producing the DC offset term. To correct this static DC error, direct conversion receivers may perform DC correction during baseband processing. However, the DC correction does not correct dynamic DC errors occurring due to thermal drift of the receiver or due to interferers that appear after an initial DC correction time associated with DC correction.

Therefore, there remains a need for a receiver architecture that essentially eliminates all static and dynamic DC errors and improves IMD2 performance.

SUMMARY OF THE INVENTION

The present invention provides a receiver frontend that eliminates static and dynamic DC errors and has improved second order intermodulation distortion (IMD2) performance. The receiver frontend includes a first mixer that multiplies a received signal and a first local oscillator (LO) signal to produce an intermediate frequency (IF) signal. A second mixer multiplies the IF signal and a second LO signal to produce an output signal. A first divider circuit divides a reference signal from a reference oscillator by a first divisor N to produce the first LO signal, and a second divider circuit divides the reference signal by a second divisor M to produce the second LO signal. Preferably, the first and second divisors N and M are each integers greater than one (1), and the second divisor M is not an integer multiple of the first divisor N.

In one embodiment, a frequency of the reference oscillator and values of the first and second divisors N and M are selected such that the second mixer produces the output signal as a baseband signal. In another embodiment, the frequency of the reference oscillator and the values of the first and second divisors N and M are selected such that the second mixer produces the output signal as a very low intermediate frequency (VLIF) signal having a VLIF offset.

In another embodiment, the first mixer is a quadrature mixer and the second mixer is a complex mixer. The quadrature mixer and the complex mixer operate to provide the output signal as a VLIF signal having a VLIF offset. In addition, the complex mixer is capable of distinguishing between positive and negative frequencies, thereby providing improved image rejection and allowing larger VLIF offsets. The receiver frontend may also include filtering circuitry to remove unwanted frequencies, including negative frequencies, from the output signal. The output of the filtering circuitry may be processed by digital signal processing circuitry to remove static and dynamic DC errors and second order intermodulation distortion components at or near DC.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
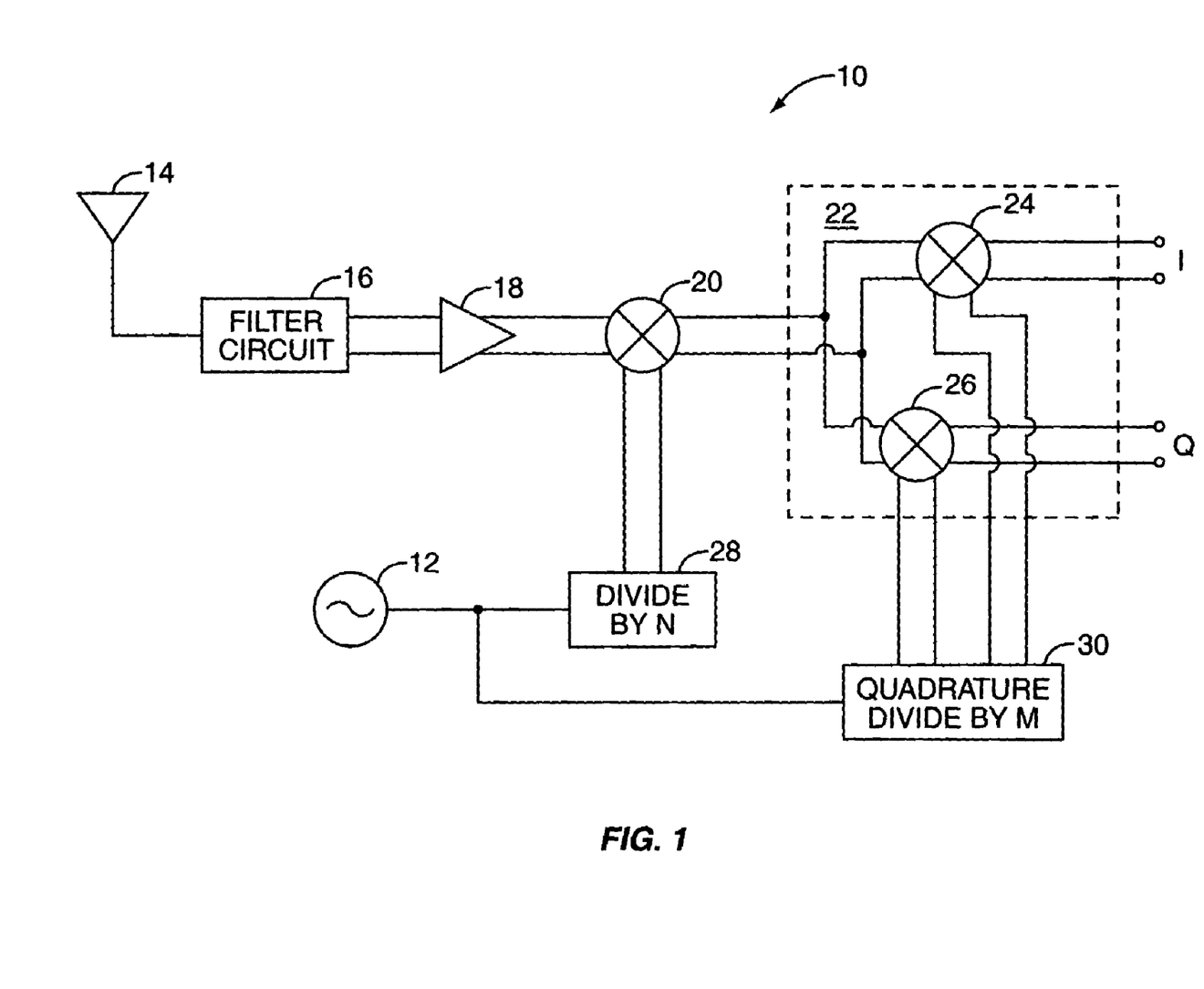
FIG. 1 illustrates a receiver frontend that generates first and second local oscillator signals from a single reference oscillator according to one embodiment of the present invention.

FIG. 1 illustrates a receiver frontend 10 that downconverts a received signal using first and second local oscillator (LO) signals derived from a single reference oscillator 12 and avoids having a LO signal on a frequency equal to or harmonically related to the frequency of the received signal. The receiver frontend 10 receives the received signal through an antenna 14. The received signal is filtered by a filter circuit 16 and amplified by a low noise amplifier (LNA) 18. After filtering and amplification of the received signal, a first mixer 20 mixes the received signal with the first local oscillator signal, thereby downconverting the received signal from a radio frequency signal to an intermediate frequency (IF) signal. A second mixer 22, which is a quadrature mixer, mixes the IF signal with the second LO signal and includes a third mixer 24 and fourth mixer 26. In one embodiment, a frequency of the second LO signal is selected such that the second mixer 22 converts the IF signal into a quadrature baseband signal.

The first LO signal is generated by a divide by N circuit 28. The divide by N circuit 28 operates to produce the first LO signal having a frequency substantially equal to a frequency of the reference oscillator 12 divided by N, where N=1, 2, 3 . . . . The second LO signal is a quadrature signal produced by a quadrature divide by M circuit 30. The second LO signal has a frequency substantially equal to the frequency of the reference oscillator 12 divided by M, where M=1, 2, 3 . . . . In one embodiment, N and M are any integers. In another embodiment, N and M are any integers wherein M is not a multiple of N and/or N is not a multiple of M. It should be noted that the frequencies of the first and second LO signals are selected by selecting values for the reference oscillator 12 and the first and second divisors N and M. It should also be noted that the reference oscillator 12 may be any type of oscillator, including but not limited to a crystal oscillator or a voltage controlled oscillator (VCO) controlled by a phase-locked loop.

As an example, assume that the received signal is centered about 833.33 MHz, the reference oscillator 12 produces a 2 GHz signal, N=4, and M=6. Therefore, the first LO signal has a frequency of 500 MHz and the second LO signal has a frequency of 333.33 MHz, where the composite of the first and second LO signals is 833.33 MHz. The mixing function results in an image located at 166.67 MHz (500-333.33 MHz).

The embodiment of the receiver frontend 10 of FIG. 1 described above eliminates leakage from the first LO signal to the LNA 18 and leakage from the LNA 18 to the first LO signal. Further, IMD2 products in the first mixer 20 are converted away from DC by the second mixer 22. However, the receiver frontend 10 may still have IMD2 issues due to mismatch within the second mixer 22 and quadrature and DC errors due to LO leakage from the IF signal into the second LO signal.

A second embodiment of the receiver frontend 10 of FIG. 1 removes any residual or dynamic DC error by converting the received signal to a very low IF (VLIF) signal rather than to a baseband signal. In this embodiment, the divisors N and M of the divide by N circuit 28 and the quadrature divide by M circuit 30 are selected such that the received signal is downconverted to an IF signal by the first mixer 20, and the second mixer 22 converts the IF signal to a quadrature VLIF signal having a VLIF offset. By converting the IF signal to VLIF rather than to baseband, any residual or dynamic DC error can be removed from the quadrature VLIF signal using a digital filter having a naturally occurring stopband null at the VLIF offset, as discussed in detail below.

As an example of converting the received signal to a VLIF signal, assume that the received signal has a frequency of 900 MHz, the desired VLIF offset is 100 KHz, N=4, and M=6. Then, the reference oscillator 12 generates a signal having a frequency of 2.16 GHz, the first LO signal has a frequency of 539.94 MHz, and the second LO signal has a frequency of 359.96 MHz. The composite of the first and second LO signals is 899.9 MHz. Thus, the received signal at 900 MHz is downconverted to 100 KHz, and an image is located at 179.98 MHz (539.94-359.96 MHz).

Figure 2A:
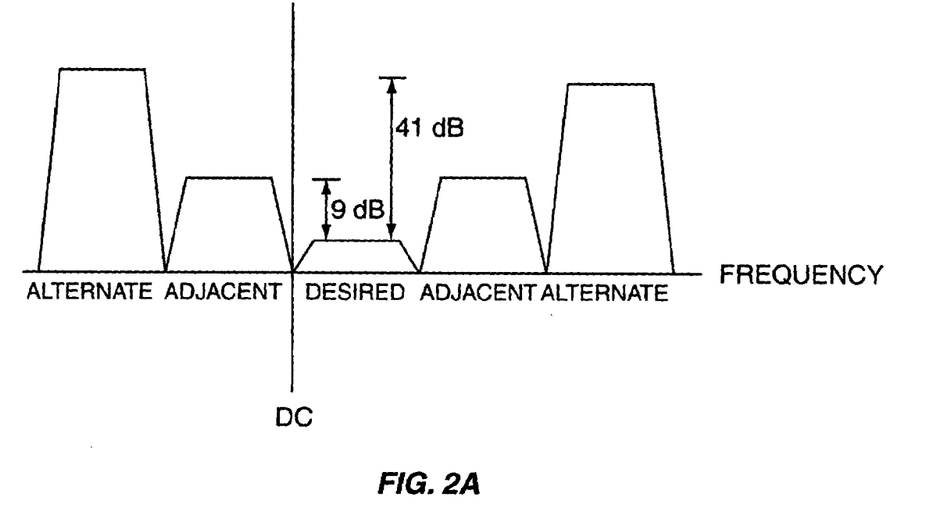
FIG. 2A illustrates desired, adjacent, and alternate channels according to GSM and EDGE standards.
Figure 2B:
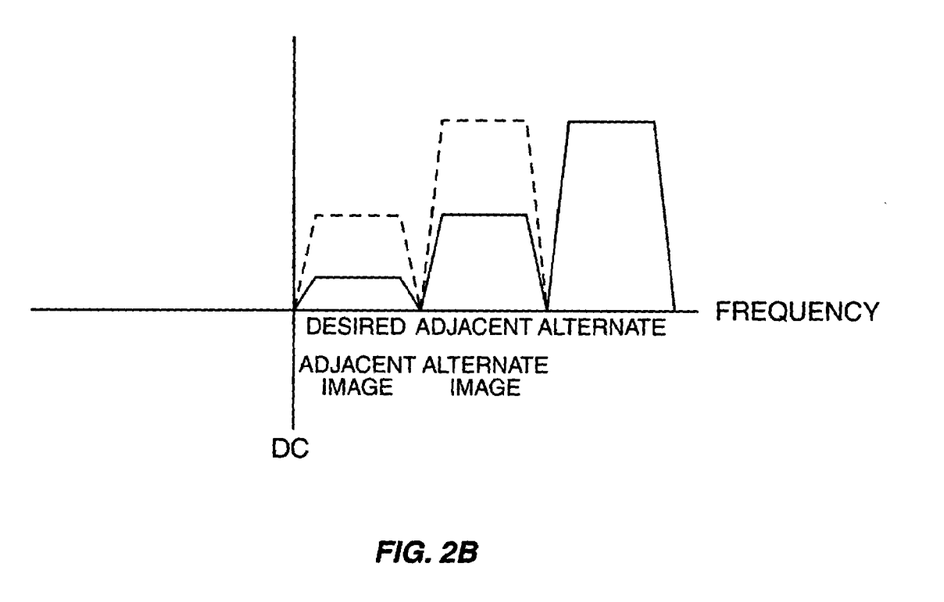
FIG. 2B illustrates imaging associated with the receiver frontend of FIG. 1 and the channels of FIG. 2A.

When converting to VLIF, the receiver frontend 10 must reject the image without filtering. In the case of converting to VLIF in a traditional Global System for Mobile Communications (GSM) system, the image to be rejected is due to adjacent and alternate channels, which are illustrated in FIG. 2A. For a 100 KHz VLIF offset, the adjacent channel below DC has a center of −100 KHz. As illustrated in FIG. 2B, if the receiver frontend 10 (FIG. 1) is unable to distinguish between positive and negative frequencies, the adjacent and alternate channels below DC are converted to the desired channel and the adjacent channel, respectively, as an adjacent image and an alternate image. In order to receive the desired channel in a typical environment, the adjacent image must be less than 9 dB below the desired channel. Since the adjacent channel is limited to being 9 dB stronger than the desired channel, a minimum of 18 dB image rejection is required. Further, since the alternate channel is limited to being 41 dB stronger than the desired channel, a minimum of 50 dB image rejection is required for a VLIF offset of 175 KHz. If the VLIF offset is 100 KHz, then the alternate image is converted to the adjacent channel. As the VLIF offset increases, the alternate image moves from the adjacent channel toward the desired channel. At 200 KHz VLIF offset, the alternate image and the desired channel are fully aligned, thereby requiring at least 50 dB image rejection.

For traditional GSM systems, which operate near 900 MHz, the VLIF offset of 100 KHz is selected such that the image is within the adjacent channel and is limited to being 9 dB stronger than the desired channel. This works well for traditional GSM channel filter bandwidths of less than 85 KHz. However, standards such as the Enhanced Data-rate for Global System for Mobile-Communication Evolution (EDGE) standard require wider bandwidths and, therefore, do not benefit from the VLIF offset of 100 KHz. To benefit from converting to VLIF, the VLIF offset must be greater than 100 KHz. However, as the VLIF offset increases, the alternate image moves toward the desired channel. When the alternate image aligns with the desired channel, the required image rejection is at least 50 dB. Therefore, in order to increase the VLIF offset, the quadrature balance of the receiver frontend 10 must be able to support an image rejection of at least 50 dB for a VLIF offset of 175 KHz.

Figure 3:
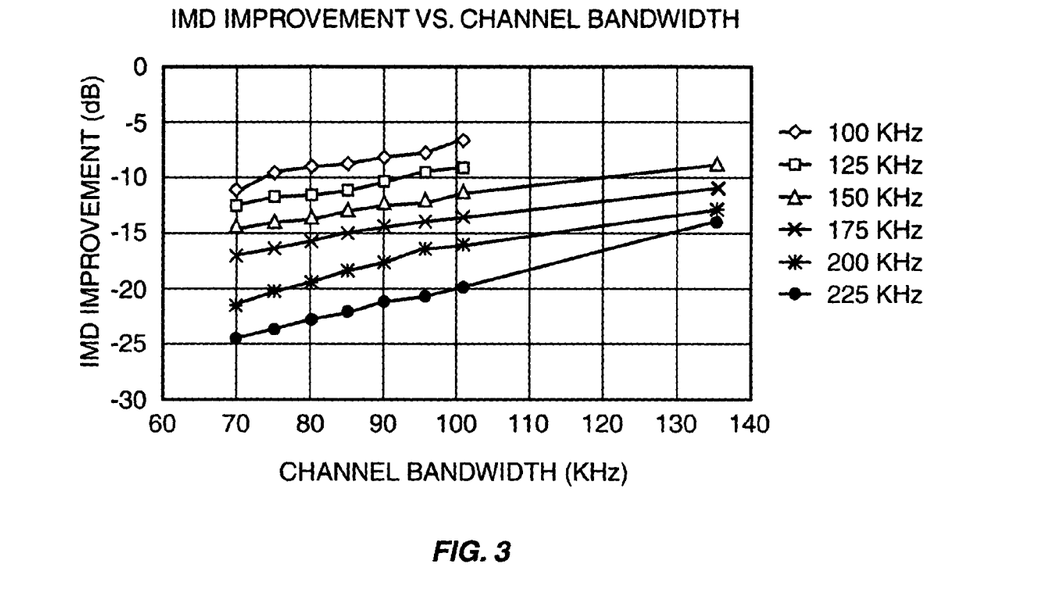
FIG. 3 illustrates a relationship between second order intermodulation distortion improvement and channel bandwidth for various VLIF offsets.
Figure 4:
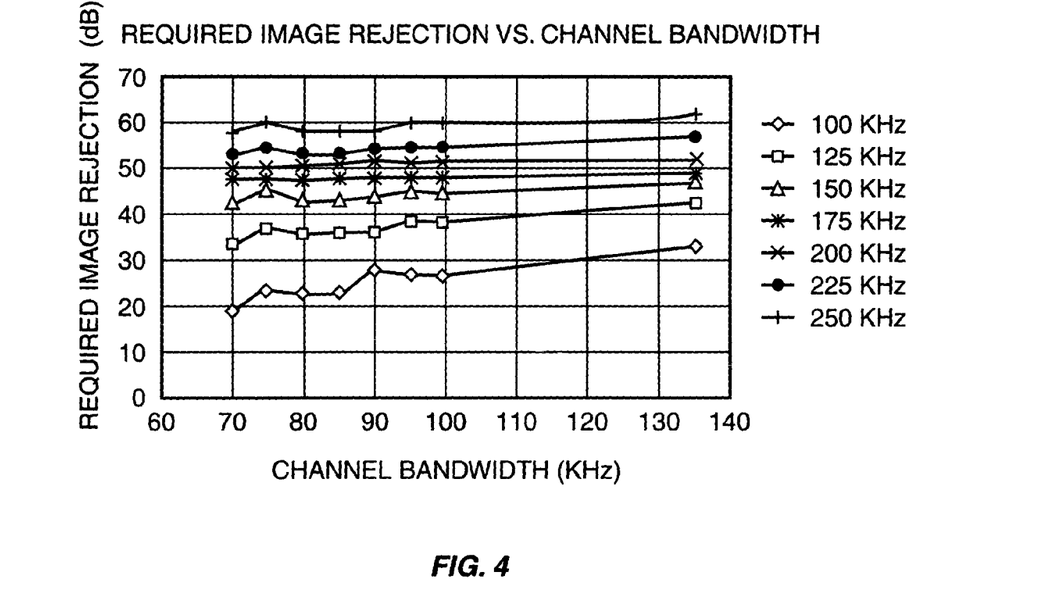
FIG. 4 illustrates a relationship between required image rejection and channel bandwidth for various VLIF offsets.

FIGS. 3 and 4 further illustrate the need for increased image rejection for VLIF offsets greater than 100 KHz in an EDGE system. FIG. 3 illustrates the relationship between IMD2 improvement and channel bandwidth for VLIF offsets of 100 KHz, 125 KHz, 150 KHz, 175 KHz, 200 KHz, and 225 KHz. FIG. 4 illustrates the relationship between required image rejection and channel bandwidth for VLIF offsets of 100 KHz, 125 KHz, 150 KHz, 175 KHz, 200 KHz, 225 KHz, and 250 KHz. The widest bandwidth requested for the EDGE standard is 135 KHz. Referring to FIG. 3, for a channel bandwidth of 135 KHz, IMD2 rejection to interferers can be improved by at least 10 dB using a VLIF offset of 175 KHz or greater. However, referring to FIG. 4, the VLIF offset of 175 KHz requires at least 50 dB image rejection.

Figure 5:
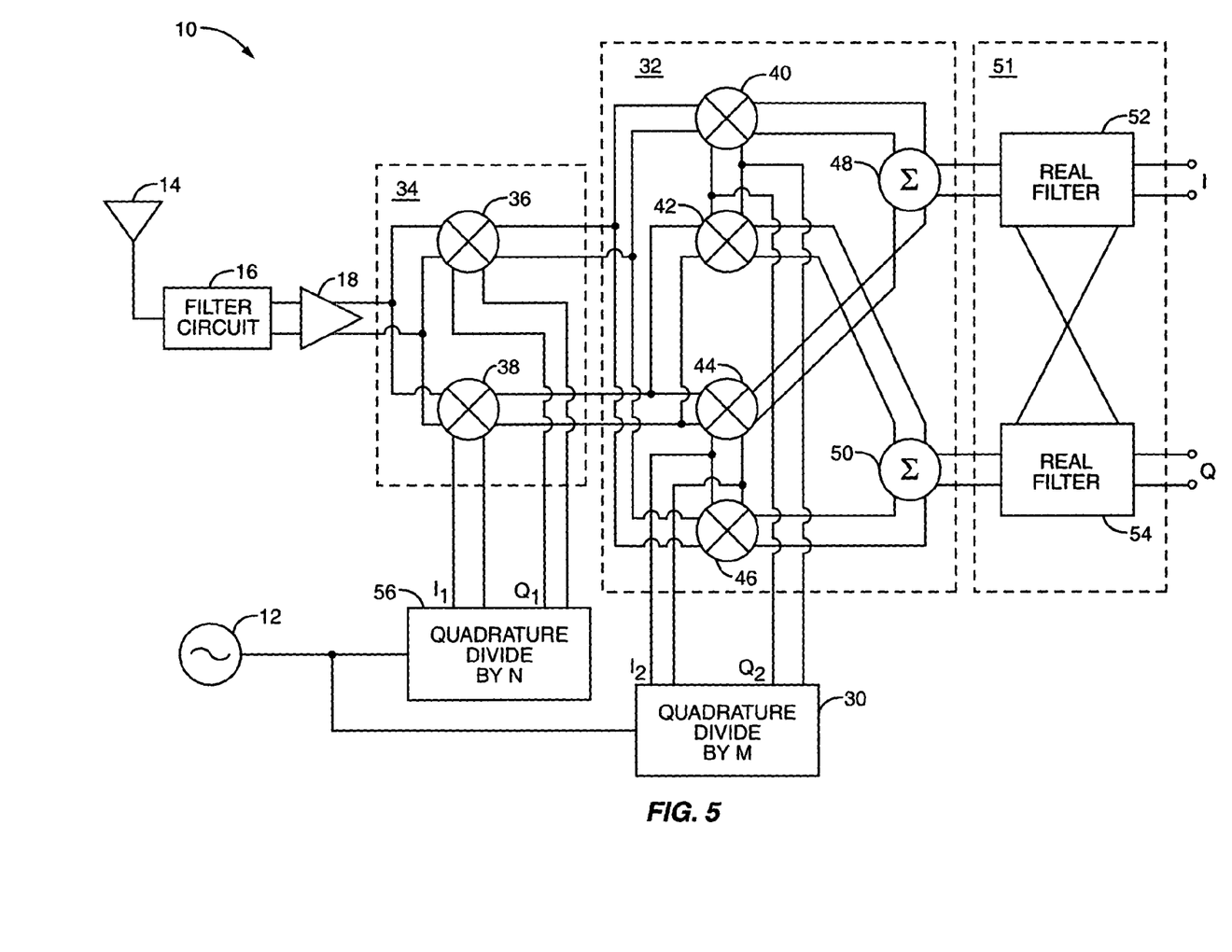
FIG. 5 illustrates a receiver frontend having improved image rejection according to another embodiment of the present invention.

FIG. 5 illustrates one embodiment of the receiver frontend 10 that provides at least 50 dB image rejection by using a complex mixer 32. The complex mixer 32 allows the receiver frontend 10 to differentiate between positive and negative frequencies. Thus, referring to FIGS. 2A and 2B, the adjacent and alternate channels below DC are not converted to the desired and adjacent channel, thereby avoiding the adjacent image in the desired channel and the alternate image in the adjacent channel. The complex mixer 32 provides the necessary image rejection of at least 50 dB as required for a 175 KHz VLIF offset.

As with the embodiment illustrated in FIG. 1, the receiver frontend 10 of FIG. 5 receives the received signal through the antenna 14, which passes the received signal to the filter circuit 16 and the LNA 18 for filtering and amplification. A quadrature mixer 34 mixes the received signal with a first quadrature LO signal, thereby converting the received signal into a quadrature IF signal. The quadrature mixer 34 includes mixers 36 and 38, which mix the received signal with quadrature ($Q_1$) and in-phase ($I_1$) components of the first quadrature LO signal, respectively. The complex mixer 32 mixes the quadrature IF signal with a second quadrature LO signal, thereby converting the quadrature IF signal into a quadrature VLIF signal. The complex mixer 32 includes mixers 40-46 and summing nodes 48-50. Mixers 40 and 44 and the first summing node 48 operate to produce the in-phase component (I) of the quadrature VLIF signal. Mixers 42 and 46 and the second summing node 50 operate to produce the quadrature phase component (Q) of the quadrature VLIF signal. The I and Q components of the quadrature VLIF signal are passed to a first polyphase filter 51 including a first real filter 52 and a second real filter 54. The first and second filters 52 and 54 are cross-coupled, thereby allowing a passband of the polyphase filter 51 to be centered about the VLIF offset of the quadrature VLIF signal rather than DC. It is important to note that the polyphase filter 51 passes only positive frequencies, and, therefore, all negative frequencies are rejected including those for the adjacent and alternate channels below DC (FIG. 2A).

The first quadrature LO signal is generated by a quadrature divide by N circuit 56. The quadrature divide by N circuit 56 operates to produce the first quadrature LO signal having a frequency substantially equal to a frequency of the reference oscillator 12 divided by N, where N=1, 2, 3 . . . . The second quadrature LO signal is produced by the quadrature divide by M circuit 30. The second quadrature LO signal has a frequency substantially equal to the frequency of the reference oscillator 12 divided by M, where M=1, 2, 3 . . . . In one embodiment, N and M are any integers. In another embodiment, N and M are any integers wherein M is not a multiple of N and/or N is not a multiple of M. As discussed above, the frequencies of the first and second LO signals are selected by selecting the frequency of the reference oscillator 12 and the values of the first and second divisors N and M such that the desired VLIF offset is achieved.

Figure 6:
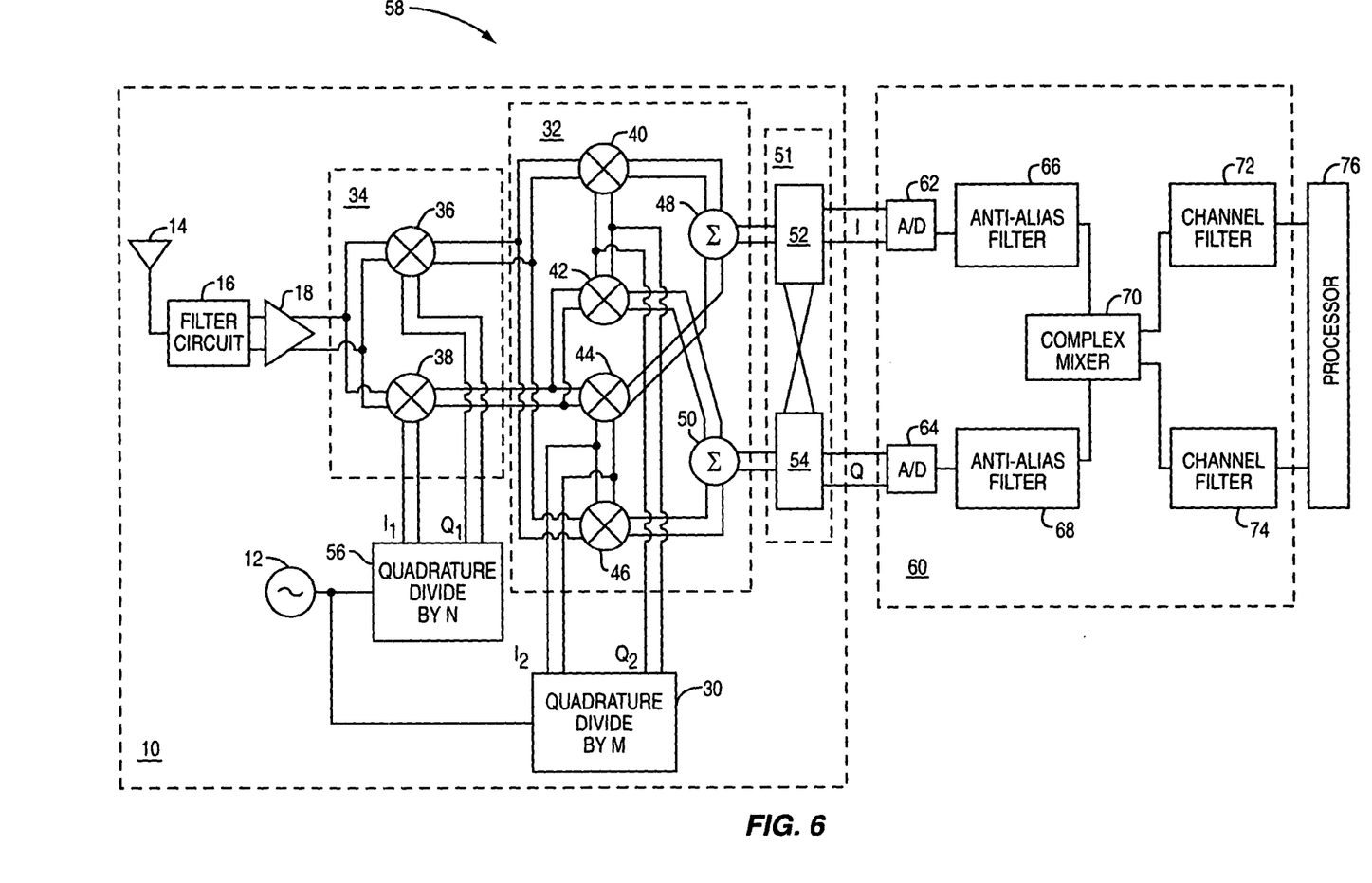
FIG. 6 illustrates a system implementing the receiver frontend of FIG. 5 according to another embodiment of the present invention.

FIG. 6 illustrates one embodiment of a system 58 implementing the receiver frontend 10 of FIG. 5 and including digital signal processing circuitry 60. As discussed above, the receiver frontend 10 operates to convert the received signal to the quadrature VLIF signal. The digital signal processing circuitry 60 operates to remove any residual or dynamic DC errors and IMD2 components at or near DC from the quadrature VLIF signal.

The digital signal processing circuitry 60 includes analog-to-digital (A/D) converters 62 and 64 that operate to produce digitized I and Q components of the quadrature VLIF signal from the receiver frontend 10. The digitized I and Q components are passed to anti-alias filters 66 and 68, respectively, which operate to remove unwanted frequencies from the digitized I and Q components. A digital complex mixer 70 then performs a complex mix of the digitized I and Q components from the anti-alias filters 66 and 68, thereby shifting the frequency of the digitized I and Q components from the VLIF offset to DC and shifting the DC errors and IMD2 components at or near DC to the VLIF offset. The digitized I and Q components from the digital complex mixer 70 are then passed to channel filters 72 and 74. The channel filters 72 and 74 operate as low-pass filters to reject the DC errors and IMD2 components, which are at the VLIF offset frequency. Preferably, the channel filters 72 and 74 are digital finite-impulse-response (FIR) filters having naturally occurring stopband nulls at the VLIF offset. After passing through the channel filters 72 and 74, the digitized I and Q components are baseband digital representations of the received signal including essentially no DC errors or IMD2 components at or near DC. The digitized I and Q components from the digital signal processing circuitry 60 are processed by a processor 76 without the need for additional DC error correction.

Figure 7:
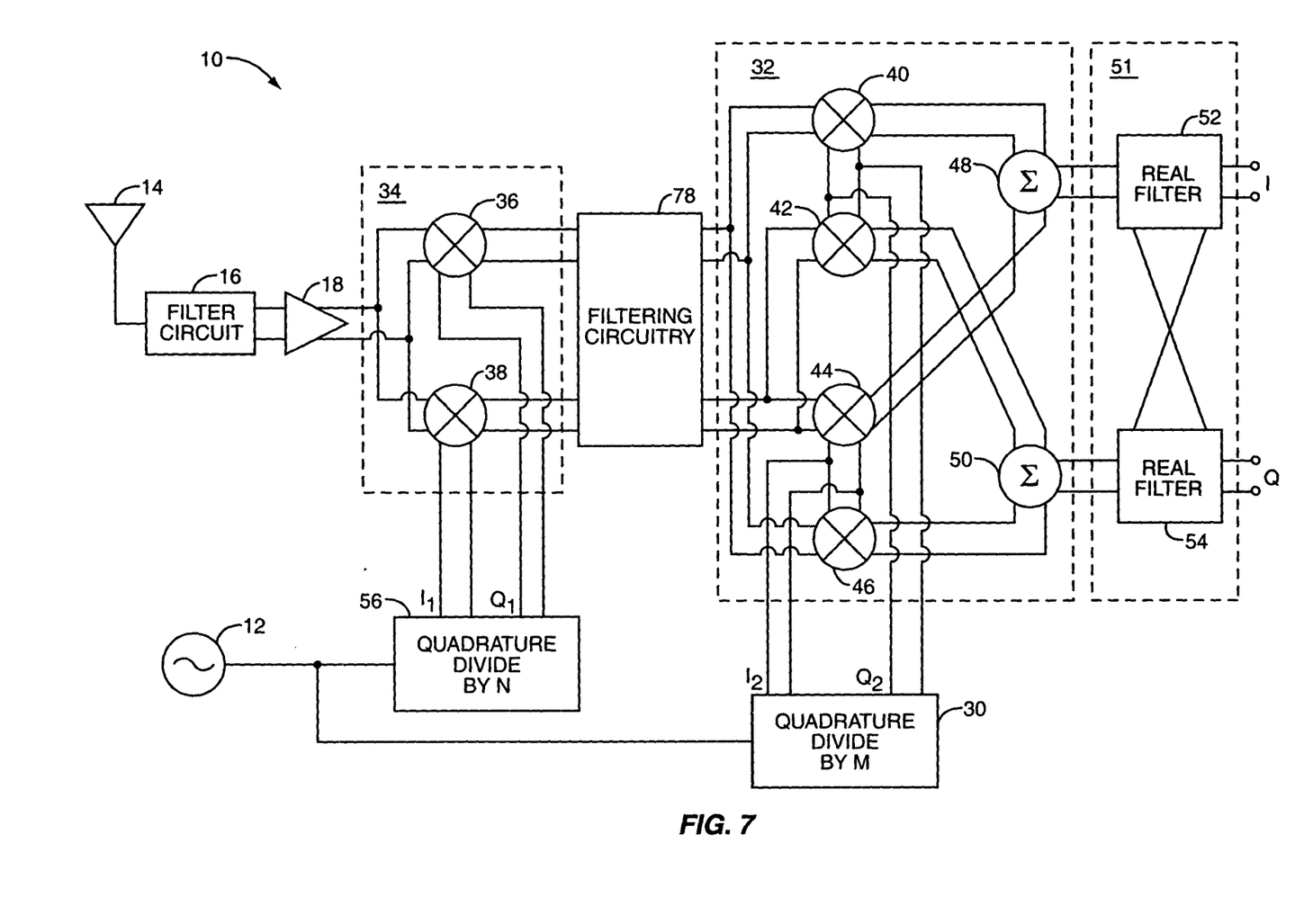
FIG. 7 illustrates the receiver frontend according to yet another embodiment of the present invention.

FIG. 7 illustrates another embodiment of the receiver frontend 10 of FIGS. 5 and 6. In this embodiment, the receiver frontend includes filtering circuitry 78 between the quadrature mixer 34 and the complex mixer 32. The filtering circuitry 78 may include a polyphase filter in order to improve the quadrature balance of the receiver frontend 10. Alternatively or in addition to a polyphase filter, the filtering circuitry 78 may include passive filtering, such as a bandpass filtering, to remove the sum product of the quadrature mixer 34. The operation of this embodiment of the receiver frontend 10 is substantially the same of the receiver frontend 10 of FIGS. 5 and 6.

The receiver frontend 10 of FIGS. 5-7 also helps avoid CMOS flicker noise. Flicker noise is noise that increases to a maximum at DC and is present in all semiconductors. Because the receiver frontend 10 converts the received signal to the VLIF offset rather than to DC, the flicker noise, which is at DC, is filtered along with the DC errors and IMD2 components at or near DC by the digital signal processing circuitry 60.

The present invention offers substantial opportunity for variation without departing from the spirit or scope of the present invention. For example, the receiver frontend 10 and the digital signal processing circuitry 60 of FIG. 6 may be formed on separate semiconductor die or on a single semiconductor die. As another example, although the receiver frontend 10 has been described and illustrated as using differential signals, which are represented by two parallel lines, single ended signals may be used and should be considered within the spirit and scope of the present invention. In addition, although much of the discussion above relates to the use of the present invention in a GSM system, the present invention may be implemented in any communication system benefiting from improved image rejection and IMD2 performance and/or removing DC errors.

Those skilled in the art will recognize improvements and modifications to the preferred embodiments of the present invention. All such improvements and modifications are considered within the scope of the concepts disclosed herein and the claims that follow.

What is claimed is:

1. A receiver comprising:
   first mixing circuitry adapted to receive a received signal and multiply the received signal by a first local oscillator (LO) signal to provide an intermediate frequency (IF) signal;
   second mixing circuitry adapted to receive the IF signal from the first mixing circuitry and multiply the IF signal by a second LO signal to provide an output signal;
   a first divider circuit adapted to receive a reference signal from a reference oscillator and divide the reference signal by a first divisor N to provide the first LO signal; and
   a second divider circuit adapted to receive the reference signal from the reference oscillator and divide the reference signal by a second divisor M to provide the second LO signal, the first divisor N and the second divisor M are each integers greater than or equal to one (1), the second divisor M is not a multiple of the first divisor N, and a frequency of the reference signal and the first and second divisors N and M are selected such that the second mixing circuitry provides the output signal as a very low intermediate frequency (VLIF) signal having a VLIF offset.

2. The receiver of claim 1 wherein the second mixing circuitry comprises a quadrature mixer and the first and second divider circuits are further adapted to provide the first and second LO signals as quadrature signals.

3. The receiver of claim 1 wherein the first mixing circuitry comprises a quadrature mixer, the second mixing circuitry comprises a complex mixer, and the first and second divider circuits are further adapted to provide the first and second LO signals as quadrature signals.

4. The receiver of claim 3 further comprising filtering circuitry adapted to receive in-phase and quadrature components of the output signal and reject negative frequencies to provide in-phase and quadrature components of a filtered output signal, wherein the filtering circuitry has a passband centered about the VLIF offset.

5. The receiver of claim 4 further comprising digital signal processing circuitry adapted to digitize the filtered output signal and process a resultant digitized signal to remove static and dynamic DC errors and second order intermodulation distortion components at or near DC.

6. The receiver of claim 5 wherein the digital signal processing circuitry comprises:
   conversion and filtering circuitry adapted to digitize the filtered output signal and remove unwanted aliases to provide the digitized signal;
   a digital complex mixer adapted to mix an in-phase component and a quadrature component of the digitized signal, thereby converting the digitized signal from the VLIF offset to baseband and converting the static and dynamic DC errors and second order intermodulation distortion at or near DC to the VLIF offset; and
   channel filtering circuitry adapted to receive an output of the digital complex mixer and perform low pass filtering, thereby removing the static and dynamic DC errors and second order intermodulation distortion to provide a digital baseband representation of the received signal.

7. The receiver of claim 4 wherein the receiver is a GSM receiver providing at least 50 dB image rejection.

8. The receiver of claim 7 wherein the VLIF offset is at least 175 KHz.

9. The receiver of claim 1 further comprising filtering circuitry between the first and second mixing circuitries, the filtering circuitry adapted to filter the IF signal and provide a filtered IF signal to the second mixing circuitry.

10. The receiver of claim 9 wherein the filtering circuitry comprises a polyphase filter.

11. The receiver of claim 9 wherein the filtering circuitry comprises a bandpass filter.

12. A receiver comprising:
   first mixing circuitry adapted to receive a received signal and multiply the received signal by a first local oscillator (LO) signal to provide an intermediate frequency (IF) signal;
   second mixing circuitry adapted to receive the IF signal from the first mixing circuitry and multiply the IF signal by a second LO signal to provide an output signal;
   a first divider circuit adapted to receive a reference si al from a reference oscillator and divide the reference signal by a first divisor N to provide the first LO signal:
   a second divider circuit adapted to receive the reference signal from the reference oscillator and divide the reference si al by a second divisor M to provide the second LO signal; and
   filtering circuitry between the first and second mixing circuitries, the filtering circuitry comprises a polyphase filter and a bandpass filter, is adapted to filter the IF signal, and provide a filtered IF signal to the second mixing circuitry wherein the first divisor N and the second divisor M are each integers greater than or equal to one (1) and the second divisor M is not a multiple of the first divisor N, and a frequency of the reference signal and the first and second divisors N and M are selected such that the second mixing circuitry provides the output signal as a very low intermediate frequency (VLIF) signal having a VLIF offset.

13. A receiver comprising:
   means for mixing a received signal and a first local oscillator (LO) signal to provide an intermediate frequency (IF) signal;
   means for mixing the IF signal and a second LO signal to provide an output signal;
   means for dividing a reference signal from a reference oscillator by a first divisor N to provide the first LO signal; and
   means for dividing the reference signal by a second divisor M to provide the second LO signal, the first divisor N and the second divisor M are each integers greater than or equal to one (1), the second divisor M is not a multiple of the first divisor N, and a frequency of the reference signal and the first and second divisors N and M are selected such that the means for mixing the IF signal and the second LO signal provides the output signal as a very low intermediate frequency (VLIF) signal having a VLIF offset.

14. The receiver of claim 13 wherein the means for dividing the reference signal by the first divisor N and the means for dividing the reference signal by the second divisor M are further adapted to provide the first and second LO signals as quadrature signals, further wherein the means for mixing the IF signal and the second LO signal multiplies the first and second LO signals in quadrature.

15. The receiver of claim 13 wherein the means for mixing the received signal and the first LO signal provides the IF signal as a quadrature signal, the means for mixing the IF signal and the second LO signal performs a complex multiplication of the IF signal and the second LO signal, and the means for dividing the reference signal by the first divisor N and the means for dividing the reference signal by the second divisor M are further adapted to provide the first and second LO signals as quadrature signals.

16. The receiver of claim 15 further comprising means for filtering in-phase and quadrature components of the output signal and rejecting negative frequencies to provide in-phase and quadrature components of a filtered output signal, wherein the means for filtering has a passband centered about the VLIF offset.

17. The receiver of claim 16 further comprising means for digitizing the filtered output signal and processing a resultant digitized signal to remove static and dynamic DC errors and second order intermodulation distortion components at or near DC.

18. The receiver of claim 16 further comprising:
means for digitizing the filtered output signal and filtering unwanted aliases to provide a digitized signal;
means for converting the digitized signal from the VLIF offset to baseband and converting the static and dynamic DC errors and second order intermodulation distortion at or near DC to the VLIF offset to provide a converted digitized signal; and
means for low-pass filtering the converted digitized signal, thereby removing the static and dynamic DC errors and second order intermodulation distortion to provide a digital baseband representation of the received signal.

19. The receiver of claim 16 wherein the receiver is a GSM receiver providing at least 50 dB image rejection.

20. The receiver of claim 19 wherein the VLIF offset is at least 175 KHz.

21. The receiver of claim 13 further comprising a means for filtering adapted to filter the IF signal and provide a filtered IF signal to the means for mixing the IF signal and a second LO signal.

22. The receiver of claim 21 wherein the means for filtering comprises a polyphase filter.

23. The receiver of claim 21 wherein the means for filtering comprises a bandpass filter.

24. The receiver of claim 21 wherein the means for filtering comprises a polyphase filter and a bandpass filter.

25. A method for converting a received signal to a baseband signal comprising:
mixing a received signal and a first local oscillator (LO) signal to provide an intermediate frequency (IF) signal;
mixing the IF signal and a second LO signal to provide an output signal;
dividing a reference signal from a reference oscillator by a first divisor N to provide the first LO signal; and
dividing the reference signal by a second divisor M to provide the second LO signal, the first divisor N and the second divisor M are each integers greater than or equal to one (1), the second divisor M is not a multiple of the first divisor N, and a frequency of the reference signal and the first and second divisors N and M are selected such that the mixing the IF signal and the second LO signal step provides the output signal as a very low intermediate frequency (VLIF) signal having a VLIF offset.

26. The method of claim 25 wherein the dividing the reference signal by the first divisor N step and the dividing the reference signal by the second divisor M step further include providing the first and second LO signals as quadrature signals, further wherein the mixing the IF signal and the second LO signal step mixes the first and second LO signals in quadrature.

27. The method of claim 25 wherein the mixing the received signal and the first LO signal step provides the IF signal as a quadrature signal, the mixing the IF signal and the second LO signal step performs a complex multiplication of the IF signal and the second LO signal, and the dividing the reference signal by the first divisor N step and the dividing the reference signal by the second divisor M step are further adapted to provide the first and second LO signals as quadrature signals.

28. The method of claim 27 further comprising filtering in-phase and quadrature components of the output signal and rejecting negative frequencies to provide in-phase and quadrature components of a filtered output signal, wherein the filtering step has a passband centered about the VLIF offset.

29. The method of claim 28 further comprising digitizing the filtered output signal and processing the digitized signal to remove static and dynamic DC errors and second order intermodulation distortion components at or near DC.

30. The method of claim 28 further comprising:
digitizing the filtered output signal and filtering unwanted aliases to provide a digitized signal;
converting the digitized signal from the VLIF offset to baseband and converting the static and dynamic DC errors and second order intermodulation distortion at or near DC to the VLIF offset to provide a converted digitized signal; and
low-pass filtering the converted digitized signal to remove the static and dynamic DC errors and second order intermodulation distortion and provide a digital baseband representation of the received signal.

31. The method of claim 28 wherein the method provides at least 50 dB image rejection.

32. The method of claim 31 wherein the VLIF offset is at least 175 KHz.

33. The method of claim 25 further comprising filtering the IF signal prior to the step of mixing the IF signal and a second LO signal.

* * * * *